(12) United States Patent
Goto et al.

(10) Patent No.: US 11,637,541 B2
(45) Date of Patent: Apr. 25, 2023

(54) JOINED BODY AND ELASTIC WAVE ELEMENT

(71) Applicant: NGK INSULATORS, LTD., Nagoya (JP)

(72) Inventors: Masashi Goto, Nagoya (JP); Tomoyoshi Tai, Inazawa (JP); Mai Minoura, Kasugai (JP)

(73) Assignee: NGK INSULATORS, LTD., Nagoya (JP)

( * ) Notice: Subject to any disclaimer, the term of this patent is extended or adjusted under 35 U.S.C. 154(b) by 492 days.

(21) Appl. No.: 16/796,036

(22) Filed: Feb. 20, 2020

(65) Prior Publication Data
US 2020/0195217 A1 Jun. 18, 2020

Related U.S. Application Data

(63) Continuation of application No. PCT/JP2018/030853, filed on Aug. 21, 2018.

(30) Foreign Application Priority Data

Aug. 25, 2017 (JP) .............................. JP2017-162223

(51) Int. Cl.
*H03H 9/02* (2006.01)
*H03H 9/25* (2006.01)

(52) U.S. Cl.
CPC .... *H03H 9/02826* (2013.01); *H03H 9/02559* (2013.01); *H03H 9/25* (2013.01)

(58) Field of Classification Search
CPC ... H03H 9/02826; H03H 9/25; H03H 9/02559
See application file for complete search history.

(56) References Cited

U.S. PATENT DOCUMENTS

| 7,213,314 B2 | 5/2007 | Abbott et al. |
| 8,973,229 B2 | 3/2015 | Kando et al. |

(Continued)

FOREIGN PATENT DOCUMENTS

| JP | 2000312130 A | 11/2000 |
| JP | 3774782 B2 | 5/2006 |

(Continued)

OTHER PUBLICATIONS

Japanese International Search Report for corresponding PCT/JP2018/030853, dated Oct. 30, 2018 (3 pages).

(Continued)

*Primary Examiner* — J. San Martin
(74) *Attorney, Agent, or Firm* — Flynn Thiel, P.C.

(57) ABSTRACT

A bonded body having a supporting substrate and piezoelectric material layer is provided. The supporting substrate is composed of mullite, and the material of the piezoelectric material layer is $LiAO_3$ where A represents one or more element selected from the group consisting of niobium and tantalum. An interface layer is present along an interface between the supporting body and piezoelectric material layer, and a supporting substrate-side intermediate layer is present between the interface layer and supporting substrate. Each of the interface layer and supporting substrate-side intermediate layer contains oxygen, aluminum, silicon and one or more element selected from the group consisting of niobium and tantalum as main components.

10 Claims, 5 Drawing Sheets

(56) References Cited

U.S. PATENT DOCUMENTS

| | | |
|---|---|---|
| 9,776,924 B2 | 10/2017 | Isoda et al. |
| 9,935,257 B2 * | 4/2018 | Kitamura ............ H01L 21/7684 |
| 2004/0226162 A1 | 11/2004 | Miura et al. |
| 2010/0182101 A1 | 7/2010 | Suzuki |
| 2012/0086312 A1 | 4/2012 | Kobayashi et al. |
| 2016/0049469 A1 | 2/2016 | Yoshikawa et al. |
| 2017/0093371 A1 * | 3/2017 | Takamine ........... H03H 9/02574 |
| 2017/0179371 A1 | 6/2017 | Kitamura et al. |
| 2019/0036505 A1 | 1/2019 | Akiyama et al. |

FOREIGN PATENT DOCUMENTS

| | | |
|---|---|---|
| JP | 2010-187373 A | 8/2010 |
| JP | 2012-213244 A | 11/2012 |
| JP | 2014-086400 A | 5/2014 |
| JP | 2014-147054 A | 8/2014 |
| JP | 5814727 B2 | 11/2015 |
| JP | 2017139720 A | 8/2017 |
| WO | 2014/192597 A1 | 12/2014 |
| WO | 2015186560 A1 | 12/2015 |
| WO | 2017/047604 A1 | 3/2017 |
| WO | 2017/134980 A1 | 8/2017 |
| WO | 2019039474 A1 | 2/2019 |

OTHER PUBLICATIONS

Japanese Written Opinion for corresponding PCT/JP2018/030853, dated Oct. 30, 2018 (4 pages).

English Notice of Reasons for Refusal for JP 6563616B (Application No. 2018-566327) (3 pages).

English Decision to Grant a Patent for JP 6563616B (Application No. 2018-566327) (2 pages).

Notice of Reasons for Refusal with English Translation for corresponding JP Application No. 2019-093433, dated Jan. 23, 2020 (12 pages).

Japanese International Search Opinion with English Translation for corresponding PCT/JP2018/030853, dated Mar. 5, 2020 (14 pages).

Korean Office Action with English translation issued in corresponding Korean Application No. 10-2020-7005129 dated May 25, 2021 (8 pages).

* cited by examiner

JOINED BODY AND ELASTIC WAVE ELEMENT

CROSS-REFERENCE TO RELATED APPLICATIONS

This is a continuation of PCT/JP2018/030853, filed Aug. 21, 2018, which claims priority to Japanese Application No. 2017-162223, filed Aug. 25, 2017, the entire contents of which are hereby incorporated by reference.

TECHNICAL FIELD

The present invention relates to a bonded body of a specific piezoelectric material layer and a supporting substrate of mullite.

BACKGROUND ARTS

Surface acoustic wave devices functioning as filter devices or oscillators used in mobile phones or the like, and acoustic wave devices such as lamb wave devices or film bulk acoustic resonators (FBAR) using a piezoelectric thin film are known. As such an acoustic wave device, a device produced by adhering a supporting substrate and a piezoelectric substrate propagating a surface acoustic wave, and by providing interdigitated electrodes capable of oscillating the surface acoustic wave on a surface of the piezoelectric substrate, is known. By adhering the supporting substrate whose thermal expansion coefficient is lower than that of the piezoelectric substrate onto the piezoelectric substrate, the change of size of the piezoelectric substrate responsive to temperature change is reduced so that the change of the frequency characteristics as the surface acoustic wave device are reduced.

For example, in patent document 1, a surface acoustic wave device having a structure produced by adhering a piezoelectric substrate and silicon substrate with an adhesive layer composed of an epoxy adhering agent is disclosed.

It is known that, in bonding a piezoelectric substrate and silicon substrate, a silicon oxide film is formed on a surface of the piezoelectric substrate and that a silicon substrate and the piezoelectric substrate are bonded through the silicon oxide film (patent document 2). In the case of the bonding, a plasma beam is irradiated onto the surfaces of the silicon oxide film and the silicon substrate to activate the surfaces, followed by the direct boding (Plasma activation method).

Further, it is known that if a surface of the piezoelectric substrate is roughened, a filler layer may be provided on the roughened surface to provide a flattened surface, and a filler layer is adhered onto a silicon substrate through an adhering layer (patent document 3). According to this method, an epoxy-based or acryl-based resin is used for the filler layer and adhering layer, and the bonding surface of the piezoelectric substrate is the roughened surface to reduce the reflection of bulk wave and to reduce spurious wave.

Further, a direct bonding method of a so-called FAB (Fast Atom Beam) system (patent document 4) is known. According to this method, a neutralized atomic beam is irradiated onto the respective bonding surfaces at ambient temperature to activate them, followed by direct bonding.

On the other hand, according to patent document 5, a piezoelectric material layer directly bonded to a supporting substrate made of a ceramic material (alumina, aluminum nitride, silicon nitride) and not to a silicon substrate, through an intermediate layer, is known. The material of the intermediate layer is silicon, silicon oxide, silicon nitride or aluminum nitride.

PRIOR TECHNICAL DOCUMENTS

Patent Documents (Patent document 1) Japanese patent publication No. 2010-187373A
(Patent document 2) U.S. Pat. No. 7,213,314 B2
(Patent document 3) Japanese Patent No. 5,814,727 B
(Patent document 4) Japanese Patent Publication No. 2014-086400A
(Patent document 5) U.S. Pat. No. 3,774,782 B

SUMMARY OF THE INVENTION

The inventors have researched bonding a supporting substrate, particularly composed of mullite, onto a piezoelectric material layer composed of lithium niobate or lithium tantalate strongly and stably. The reason is that it is preferred to make the piezoelectric material layer thin by polishing after the supporting substrate is bonded to the piezoelectric material layer in light of the performance and that fine separation occurs during the polishing if the bonding strength is low.

However, it proved to be difficult to bond the piezoelectric material layer composed of lithium niobate or lithium tantalate onto the supporting substrate composed of mullite strongly and stably.

An object of the present invention is to provide microstructure capable of bonding the piezoelectric material layer composed of lithium niobate or lithium tantalate onto the supporting substrate composed of mullite strongly and stably.

Solution for the Object

The present invention provides a bonded body comprising a supporting substrate and a piezoelectric material layer, said supporting substrate comprising mullite, and said piezoelectric material layer comprising a material comprising $LiAO_3$ (A represents one or more element selected from the group consisting of niobium and tantalum, wherein said bonded body comprises an interface layer present along an interface between said supporting substrate and said piezoelectric material layer, and a supporting substrate-side intermediate layer present between said interface layer and said supporting substrate; and wherein each of said interface layer and said supporting substrate-side intermediate layer comprises oxygen, aluminum, silicon and one or more element selected from the group consisting of niobium and tantalum, as main components.

According to an aspect of the present invention, a microstructure is provided which allows the piezoelectric material layer composed of lithium niobate or lithium tantalate can be bonded onto the supporting substrate composed of mullite strongly and stably.

EMBODIMENTS FOR CARRYING OUT THE INVENTION

Figure 1A:
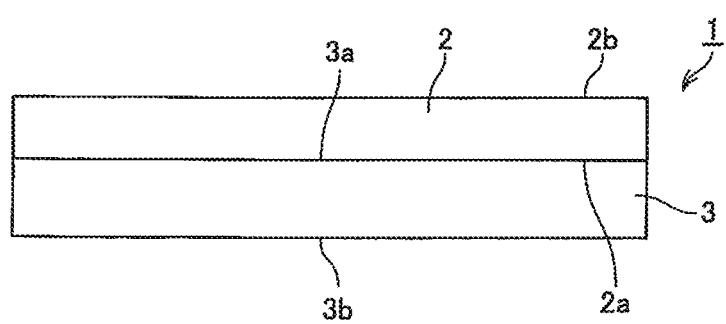
FIG. 1(*a*) is a diagram schematically showing a bonded body 1 according to an embodiment of the present invention, and FIG. 1(*b*) is an enlarged view of a part of the bonded body 1.

The present invention will be described in detail below, appropriately referring to attached drawings.

The bonded body of the present invention includes a supporting substrate and a piezoelectric material layer, the supporting substrate being composed of mullite, and the piezoelectric material substrate made of a material of $LiAO_3$ (A represents one or more element selected from the group consisting of niobium and tantalum). For example, according to a bonded body 1 shown in FIG. 1(a), an activated surface 3a of a supporting substrate 3 is bonded to an activated surface 2a of a piezoelectric material layer 2 by direct bonding. Further, 2b represents a main surface of the piezoelectric material layer 2, and 3b represents a main surface of the supporting substrate 3.

Figure 1B:
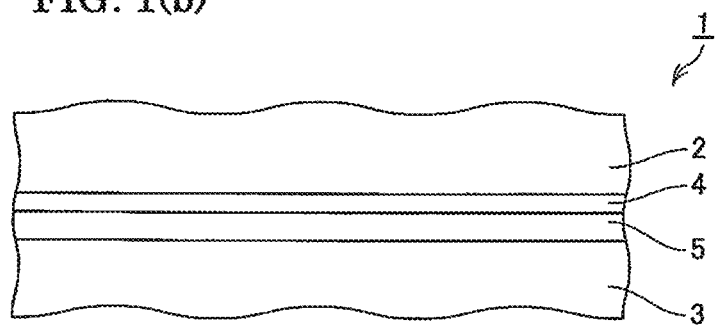

A bonding interface of the bonded body of FIG. 1(a) is enlarged and shown as a schematic diagram in FIG. 1(b).

An interface layer 4 is provided along an interface between the supporting substrate 3 and piezoelectric material layer 2, and a supporting substrate-side intermediate layer 5 is present between the interface layer 4 and supporting substrate 3. Each of the interface layer 4 and supporting substrate-side intermediate layer 5 is composed of a material containing one or more element selected from the group consisting of niobium or tantalum, and oxygen, aluminum and silicon as main components.

The material of the piezoelectric material layer is $LiAO_3$. Here, A represent one or more element selected from the group consisting of niobium and tantalum. Thus, $LiAO_3$ may be lithium niobate, lithium tantalate or lithium niobate-lithium tantalate solid solution.

The supporting substrate is composed of mullite. Mullite is a ceramic composed of mullite crystals each having a composition of $3Al_2O_3 \cdot 2SiO_2(Al_6O_{13}Si_2)$. Mullite may preferably be of a sintered body, and its production method is not particularly limited.

The relative density of mullite used in the present invention may preferably be 99.5 percent or higher and may be 100 percent, depending on bonding strength. The relative density is to be measured by the Archimedes method. Further, the purity of mullite may preferably be 98 percent or higher and more preferably be 99 percent or higher, depending on bonding strength.

Figure 2:
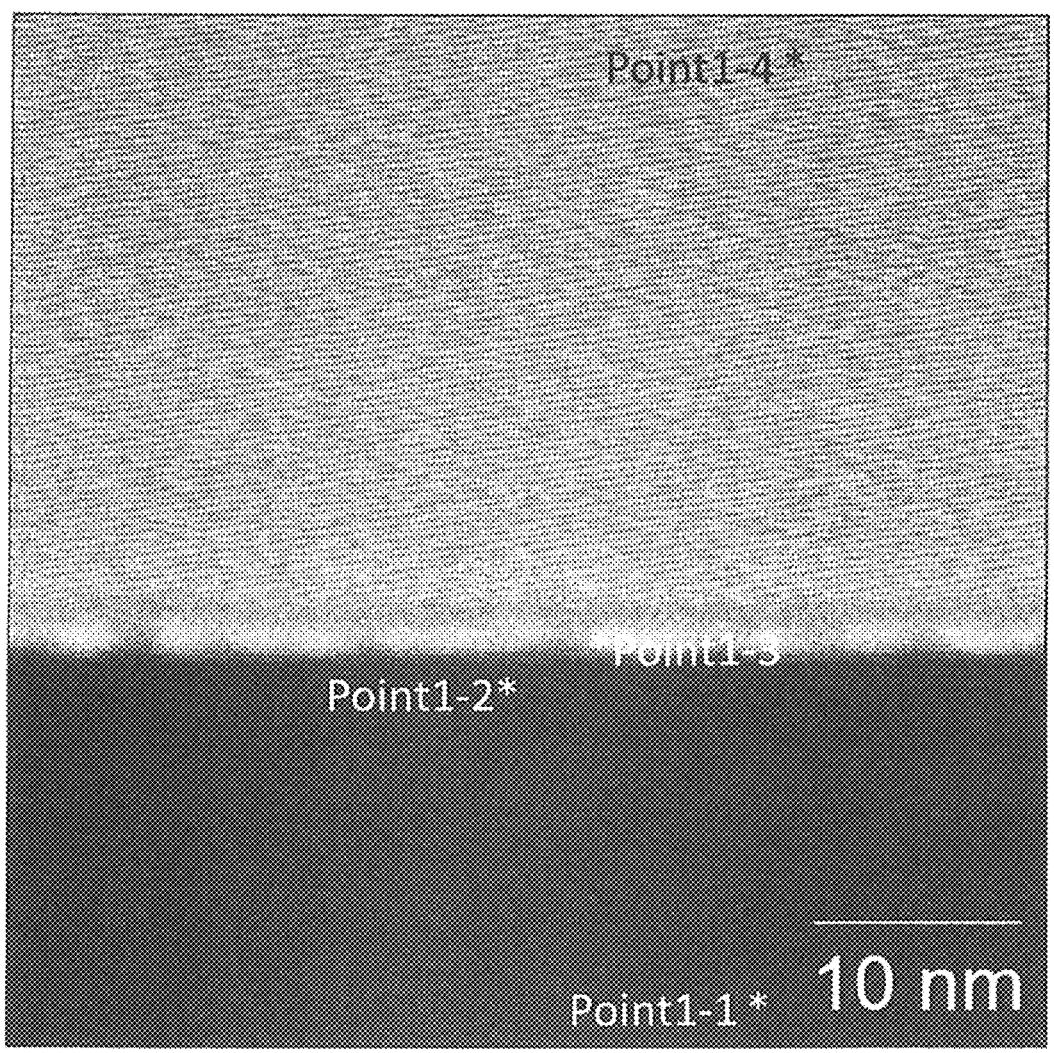
FIG. 2 is a photograph showing a part of a bonded body according to an embodiment of the present invention.

The compositions of the respective layers shown in FIGS. 1(b) and 2 are as follows.
Composition of supporting substrate: $Al_6O_{13}Si_2$
Composition of piezoelectric material layer 2: $LiAO_3$ (A=Ta, Nb)

Then, at the stage of directly bonding the supporting substrate 3 and piezoelectric material layer 2, the activation conditions of the respective bonding surfaces are controlled to generate appropriate atomic diffusion along the interface of the both, so that the interface layer 4 and supporting substrate-side intermediate layer 5 can be generated. That is, each of the interface layer and supporting substrate-side intermediate layer contains one or more element (A) selected from the group consisting of niobium and tantalum, plus oxygen (O), aluminum (Al) and silicon (Si) as main components. This means that one or more element (A) selected from the group consisting of niobium and tantalum diffuses from the piezoelectric material layer 2 to the side of the supporting substrate 3. This further means that aluminum (Al) and silicon (Si) diffuse from the supporting substrate 3 ($Al_6O_{13}Si_2$) to the piezoelectric material layer ($LiAO_3$).

It has been found that the piezoelectric material layer composed of lithium niobate or lithium tantalate can be bonded onto the supporting substrate composed of mullite strongly and stably, by applying such a microstructure.

Further, "the material contains one or more element (A) selected from the group consisting of niobium and tantalum, plus oxygen (O), aluminum (Al) and silicon (Si)" as "main components" means that a total of these elements is 95 atomic percent or higher and may preferably be 97 atomic percent or higher, provided that 100 is assigned to a total of all the elements.

As the inventors have further researched these compositions in detail, the following was found. In the case that the silicon ratio of the interface layer 4 is higher than the silicon ratio of the supporting substrate-side intermediate layer 5, the bonding strength is considerably improved in particular and bulk fracture tends to occur in parts other than the bonding interface.

The reasons are not clear. As silicon (Si) atoms diffuse from the supporting substrate to the piezoelectric material layer 2, it is conventionally considered that the silicon ratio of the supporting substrate-side intermediate layer 5 should be higher than the silicon ratio of the interface layer 4. However, the supporting substrate-side intermediate layer and interface layer are very thin, so that the diffusion of silicon is facilitated depending on the activation state of each bonding surface. It is thus considered that the diffusion of silicon is concentrated in the interface layer 4 slightly distant from the supporting substrate 3. Then, it is found that the bonding strength is considerably improved when such diffusion takes place.

Figure 3:
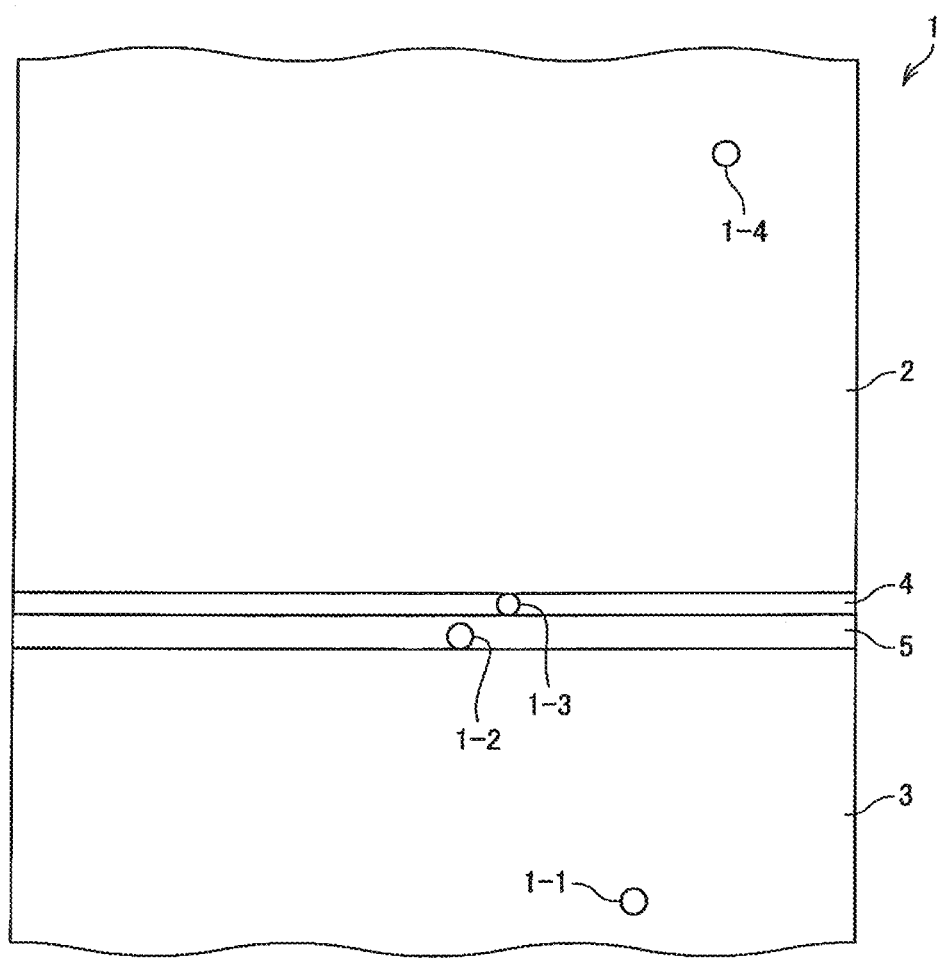
FIG. 3 is a diagram illustrating the photograph of FIG. 2.

According to a preferred embodiment, for example as shown in FIGS. 2 and 3, the interface layer 4 is bright and the supporting substrate-side intermediate layer 5 is dark. However, this photograph is a bright-field image taken by a transmission type electron microscope under the following conditions.

Measuring System:
The microstructure is observed using a transmission type electron microscope (supplied by JEOL Ltd., "JEM-ARM200F").

Measurement Conditions:
A sample is thinned by FIB (Focused Ion Beam) method and observed at an acceleration voltage of 200 kV.

According to the present invention, each of the atomic ratios of the supporting substrate, supporting substrate-side intermediate layer, interface layer and piezoelectric material layer is determined as follows.

Measuring System:
Elemental analysis system (supplied by JEOL Ltd., "JED-2300T").

Measurement Conditions:

A sample is thinned by FIB (Focused Ion Beam) method and observed at an acceleration voltage of 200 kV, an X-ray take-off angle of 21.9°, a solid angle of 0.98sr and a capture time of 30 seconds.

Processing of Measured Values:

Atomic ratios of one or more of element (A) selected from the group consisting of niobium and tantalum, oxygen (O), aluminum (Al), silicon (Si) and argon (Ar) are measured at the respective parts of the piezoelectric material layer, interface layer, supporting substrate-side intermediate layer and supporting substrate. The atomic ratio of the element (A) is a total of the ratios of Ta and Nb. At this time, at the respective parts, the respective atomic ratios (atom %) of the respective atoms are calculated so that 100% is assigned to a total of the atomic ratios of the respective elements.

Then, the atomic ratios of aluminum (Al) and silicon (Si) of the supporting substrate are converted to 100, and, responsive to this, the atomic ratios of aluminum (Al) and silicon (Si) of the other layers are calculated. These are indications of the diffusion of aluminum and silicon from the supporting substrate to the other respective layers. In the piezoelectric material layer, the atomic ratios of aluminum (Al) and silicon (Si) are 0.

Further, the atomic ratio of one or more element (A) selected from the group of niobium and tantalum of the piezoelectric material layer is converted to 100, and, responsive to this, the atomic ratios of the element (A) of the respective layers are calculated. These are indications of the diffusion of the element (A) from the piezoelectric material layer to the other respective layers. The atomic ratio of the element (A) of the supporting substrate is 0.

According to a preferred embodiment, the silicon ratio of the interface layer is 41 or higher, provided that 100 is assigned to the silicon ratio of the supporting substrate. By elevating the ratio to 41 or higher, the bonding strength is further improved. The silicon ratio of the interface layer may preferably be 51 or higher and more preferably be 61 or higher.

Further, according to a preferred embodiment, the silicon ratio of the interface layer is 98 or lower, provided that 100 is assigned to the silicon ratio of the supporting substrate. The silicon ratio of the interface layer may preferably be 89 or lower and more preferably be 79 or lower.

According to the present invention, the silicon ratio of the interface layer may be lower than the silicon ratio of the supporting substrate-side intermediate layer. In this case, however, a difference between the silicon ratios of the interface layer and the supporting substrate-side intermediate layer may preferably be 21 or smaller and more preferably be 12 or smaller, provided that 100 is assigned to the silicon ratio of the supporting substrate. Further, according to a preferred embodiment, the silicon ratio of the interface layer is higher than the silicon ratio of the supporting substrate-side intermediate layer. In this case, a difference between the silicon ratios of the interface layer and supporting substrate-side intermediate layer may preferably be 19 or larger and more preferably be 38 or larger.

According to a preferred embodiment, the aluminum ratio of the supporting substrate-side intermediate layer is higher than the aluminum ratio of the supporting substrate. This means that, in the supporting substrate-side intermediate layer, aluminum (Al) diffused from the supporting substrate is concentrated locally. The bonding strength tends to be particularly high in this case.

The aluminum ratio of the supporting substrate-side intermediate layer may preferably be 105 or higher and more preferably be 112 or higher, provided that 100 is assigned to the aluminum ratio of the supporting substrate. Further, in actuality, the aluminum ratio of the supporting substrate-side intermediate layer is 116 or lower in many cases.

The aluminum ratio of the interface layer may preferably be 31 or higher depending on bonding strength and usually 45 or lower, provided that 100 is assigned to the aluminum ratio of the supporting substrate. Further, the aluminum ratio of the interface layer may preferably be lower than the aluminum ratio of the supporting substrate-side intermediate layer.

One or more element (A) selected from the group consisting of niobium and tantalum diffuses from the piezoelectric material layer to the supporting substrate. Thus, the atomic ratio of the element (A) of the interface layer may preferably be 50 to 90 and more preferably be 60 to 88, provided that 100 is assigned to the atomic ratio of the element (A) of the piezoelectric material layer. Further, the atomic ratio of the element (A) of the supporting substrate-side intermediate layer may preferably be 6 to 30 and more preferably be 16 to 23.

Further, the atomic ratio of the element (A) of the supporting substrate-side intermediate layer is usually lower than the atomic ratio of the element (A) of the interface layer.

For example, the atomic ratio of a carrier gas such as argon (Ar) of the interface layer may preferably be 1.8 to 2.5 atom %. Further, the atomic ratio of a carrier gas such as argon (Ar) of the supporting substrate-side intermediate layer may preferably be 0.1 to 0.5 atom %.

Preferred production examples of the bonded body of the present invention will be described below.

FIGS. 4 and 5 are diagrams for illustrating a production example of directly bonding a supporting substrate onto a surface of the piezoelectric material layer.

Figure 4A:
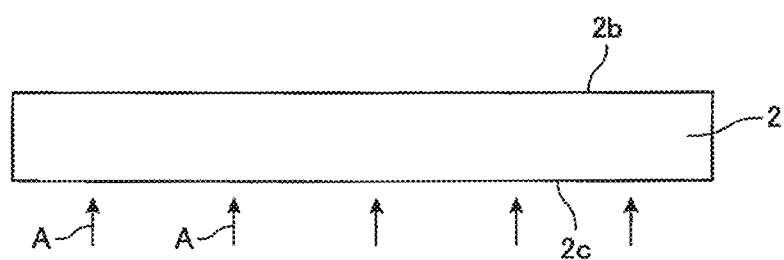
FIG. 4(a) shows a state that a surface 2c of a piezoelectric material layer 2 is activated by a neutralized beam A.

As shown in FIG. 4(a), a neutralized beam is irradiated onto a surface 2c of a piezoelectric material layer 2 as arrows A to activate the surface of the piezoelectric material layer 2 to provide an activated surface.

Figure 4B:
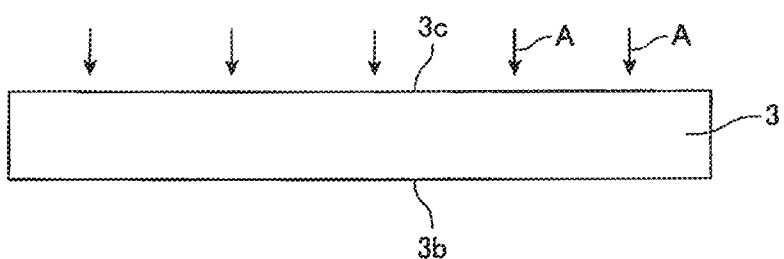
FIG. 4(b) shows a state that a surface 3c of a supporting substrate 3 is activated by neutralized beam A.
Figure 5A:
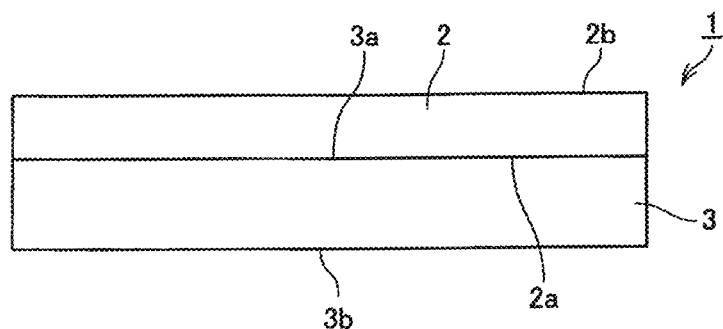
FIG. 5(a) shows a state that the piezoelectric material layer 2 and supporting substrate 3 are bonded with each other.

Further, as shown in FIG. 4(b), a neutralized beam A is irradiated onto the surface 3c of the supporting substrate 3 to activate it to provide the supporting substrate having an activated surface formed thereon. Then, as shown in FIG. 5(a), the activated surface 2a of the piezoelectric material layer 2 and the activated surface 3a of the supporting body 3 are bonded by direct bonding, to obtain a bonded body 1.

Figure 5B:
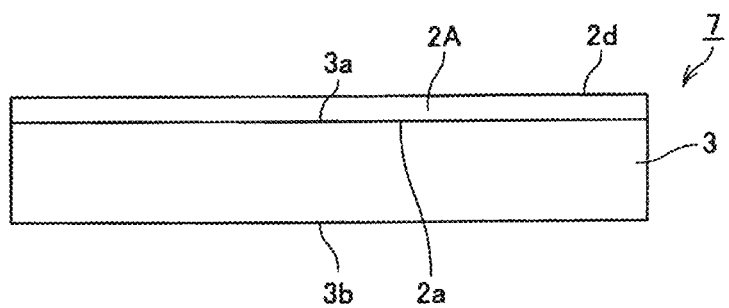
FIG. 5(b) shows a state that a piezoelectric material layer 2A is thinned by processing.

According to a preferred embodiment, the surface 2b of the piezoelectric material layer 2 of the bonded body 1 is further subjected to a polishing process to make the thickness of the piezoelectric material layer 2A smaller as shown in FIG. 5(b) to obtain a bonded body 7. 2d represents a polished surface.

Figure 5C:
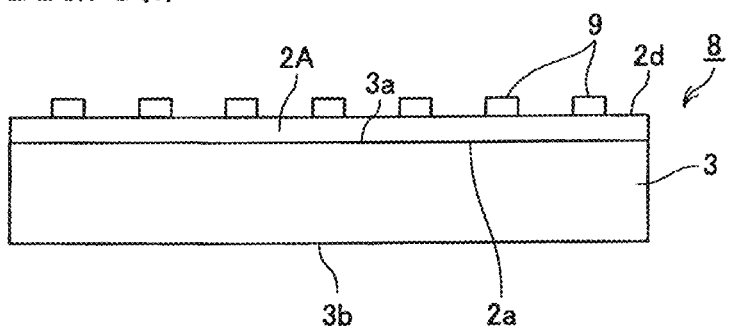
FIG. 5(c) shows a state that an electrode 9 is provided on the piezoelectric material layer 2A.

In FIG. 5(c), electrodes 9 are formed on the polished surface 2d of the piezoelectric material layer 2A to produce a surface acoustic wave device 8.

The respective constituents of the present invention below are further described below.

Applications of the bonded body of the present invention are not particularly limited, and the bonded body may be appropriately applied to an acoustic wave device and optical device, for example.

As the acoustic wave device, a surface acoustic wave device, Lamb wave-type device, thin film resonator (FBAR) or the like may be produced. For example, the surface acoustic wave device is produced by providing input side IDT (Interdigital transducer) electrodes (also referred to as comb electrodes or interdigitated electrodes) for oscillating surface acoustic wave and IDT electrodes on the output side for receiving the surface acoustic wave, on the surface of the piezoelectric material layer. By applying a high frequency signal on the IDT electrode on the input side, an electric field is generated between the electrodes, so that the surface acoustic wave is oscillated and propagated on the piezoelectric material layer. Then, the propagated surface acoustic wave can be drawn as an electrical signal from the IDT electrodes on the output side provided in the direction of the propagation.

A metal film may be provided on a bottom surface of the piezoelectric material layer. After the lamb type device is produced as the acoustic wave device, the metal film plays a role of improving the electro-mechanical coupling factor near the bottom surface of the piezoelectric material layer. In this case, the Lamb type device has a structure such that interdigitated electrodes are formed on the surfaces of the piezoelectric material layer and the metal film on the piezoelectric material layer is exposed through a cavity provided in the supporting substrate. The material of such a metal film includes aluminum, an aluminum alloy, copper, gold or the like, for example. Further, when a Lamb wave device is produced, a composite substrate having the piezoelectric material layer without the metal film on the bottom surface may be used.

Further, a metal film and an insulating film may be provided on the bottom surface of the piezoelectric material layer. The metal film plays the role of electrodes in the case that a thin film resonator is produced as the acoustic wave device. In this case, the thin film resonator has a structure such that electrodes are formed on the upper and bottom surfaces of the piezoelectric material layer, and the insulating film has a cavity to expose the metal film on the piezoelectric material layer. The material of such a metal film includes molybdenum, ruthenium, tungsten, chromium, aluminum or the like, for example. Further, the material of the insulating film includes silicon dioxide, phosphorus silicate glass, boron phosphorus silicate glass or the like.

Further, as the optical device, it may be an optical switching device, wavelength conversion device, or optical modulating device. Further, a periodic domain inversion structure may be formed in the piezoelectric material layer.

In the case that the object of the present invention is a surface acoustic wave device and the material of the piezoelectric material layer is lithium tantalate, the layer in which it is rotated is preferably at an angle of 36 to 47° (for example 42°) from Y-axis toward Z-axis around X-axis, the direction of propagation of surface acoustic wave, thanks to the low propagation loss.

Further, in the case that the piezoelectric material layer is composed of lithium niobate, the layer in which it is rotated is preferably at an angle of 60 to 68° (for example 64°) from Y-axis toward Z-axis around X-axis, the direction of propagation of surface acoustic wave, thanks to the low propagation loss. Further, although the size of the piezoelectric material layer is not particularly limited, the diameter is preferably 50 to 150 mm and the thickness 0.2 to 60 µm, for example.

The following method is preferred for obtaining the bonded body of the present invention.

First, the surfaces (bonding surfaces) of the piezoelectric material layer and supporting substrate are flattened to obtain flat surfaces. Here, the method of flattening each of the surfaces includes lapping, chemical mechanical polishing or the like. Further, the flat surface may preferably have Ra of 1 nm or less and more preferably have Ra of 0.3 nm or less.

Then, for removing residue of the abrasive, the surfaces of the piezoelectric material layer and supporting substrate are cleaned. The method of cleaning the surfaces includes wet cleaning, dry cleaning, scrub cleaning or the like, and scrub cleaning is preferred for obtaining cleaned surfaces easily and efficiently. At this time, it is particularly preferred to use "Semi Clean M-LO" as cleaning liquid, followed by cleaning by means of a scrub cleaning system using a mixed solvent of acetone and IPA.

A neutralized beam is then irradiated onto the surfaces of the piezoelectric material layer and supporting substrate to activate the respective flat surfaces.

In the case that a neutralized beam is used to perform the surface activation, it is preferred to use a system such as that described in patent document 4 to generate the neutralized beam, which is then irradiated. That is, a source of high-speed atomic beam of saddle field type as a beam source may be used. Inert gas is then introduced into a chamber and a high voltage is applied onto the electrodes from a direct current electric source. An electric field of saddle-field type is generated between the electrode (positive electrode) and a housing (negative electrode), so that electrons e are moved to generate beams of atoms and ions from the inert gas. Among the beams reaching a grid, the beam of the ions is neutralized at the grid so that the beam of the neutral atoms is emitted from the high-speed atomic beam source. Atomic particles forming the beam may preferably be that from an inert gas (argon, nitrogen or the like).

A voltage and current at the time of activation by irradiation of the beam may preferably be 0.5 to 2.0 kV and 50 to 200 mA, respectively.

Then, the activated surfaces are contacted and bonded with each other under vacuum atmosphere. This process is performed under ambient temperature, which is preferably 40° C. or lower and more preferably 30° C. or lower. The temperature during the bonding step may preferably be 20° C. or higher and more preferably be 25° C. or lower. The pressure during the bonding step may preferably be 100 to 20000N.

EXAMPLES

Comparative Example 1

A bonded body was obtained, according to the method described referring to FIGS. 4 and 5.

Specifically, a piezoelectric material layer 2 of lithium tantalate (LT) having an orientation flat (OF) part, a diameter of 4 inches, and thickness of 250 µm was prepared. The piezoelectric material layer 2, was used as a 46° Y-cut X-propagation LT substrate, in which the direction of propagation of the surface acoustic wave (SAW) is X and the Y-cut plate is rotated in a cutting angle. The surface 2c of the piezoelectric material layer 2 was mirror-polished to an arithmetic average roughness Ra of 1 nm.

Further, as the supporting substrate 3, a mullite substrate having an OF part, a diameter of 4 inches, and a thickness of 230 µm was prepared. The surfaces 3c of the supporting substrate 3 of mullite had an arithmetic average roughness Ra of 0.3 nm. The arithmetic average roughness was evaluated by means of an atomic force microscope (AFM) in a square visual field of a length of 10 µm and a width of 10 µm.

The supporting substrate 3 was then cleaned by a scrub cleaner. "Semi-clean M-LO" was used as the cleaning liquid and a mixed solution of acetone and IPA was then used as cleaning liquid. The supporting substrate 3 and piezoelectric material layer 2 were cleaned by means of a scrub cleaning machine and then introduced into a vacuum chamber. The inside was drawn to a vacuum of $10^{-6}$ Pa, and a high-speed atomic beam (at an acceleration voltage of 0.5 kV and a flow rate of Ar of 27 sccm) was irradiated onto each of the bonding surfaces of the substrates over 120 sec. The surface 2a with the beam irradiated surface (activated surface) of the piezoelectric material layer 2 and the activated surface 3a of the supporting substrate 3 were then contacted with each other, followed by pressurizing at 10000N over 2 minutes to bond the substrates (FIG. 5(a)).

The obtained bonded body was then subjected to the measurement of the respective atomic ratios of oxygen (O), aluminum (Al), silicon (Si), tantalum (Ta) and argon (Ar) of the piezoelectric material layer, interface layer, supporting substrate-side intermediate layer and supporting substrate, respectively. The results are shown in Table 1.

Further, Comparative Example 1 is out of the scope of the present invention, as silicon is not contained in the interface layer.

Further, the obtained bonded body was subjected to evaluation of bonding strength by a crack-opening method and obtained a value of 0.5 J/m². Further, the surface 2b of the piezoelectric material layer 2 was ground and polished so that the thickness was changed from the initial 250 μm to 30 μm. Peeling of the bonded part occurred during the grinding and polishing steps.

TABLE 1

| | Comparative Example 1 | | | | |
|---|---|---|---|---|---|
| Unit | O Relative Ratio | Al Relative Ratio | Si Relative ratio | Ta Relative ratio | Ar Atom % |
| Piezoelectric Material layer | 111 | 0 | 0 | 100 | 0 |
| Interface layer | 96 | 30 | 0 | 91 | 2.6 |
| Supporting substrate-side intermediate layer | 99 | 90 | 22 | 31 | 0.6 |
| Supporting substrate | 100 | 100 | 100 | 0 | 0 |

Inventive Example 1

A bonded body was produced according the same procedure as Comparative Example 1. However, the acceleration voltage irradiated onto the bonding surfaces of the substrates during the bonding was changed to 0.6 kV.

The obtained bonded body was then subjected to the measurement of the respective atomic ratios of oxygen (O), aluminum (Al), silicon (Si), tantalum (Ta) and argon (Ar) of the piezoelectric material layer, interface layer, supporting substrate-side intermediate layer and supporting substrate, respectively. The results are shown in Table 2.

TABLE 2

| | Inventive Example 1 | | | | |
|---|---|---|---|---|---|
| Unit | O Relative Ratio | Al Relative Ratio | Si Relative ratio | Ta Relative ratio | Ar Atom % |
| Piezoelectric Material layer | 104 | 0 | 0 | 100 | 0 |
| Interface layer | 92 | 45 | 18 | 72 | 2.0 |
| Supporting substrate-side intermediate layer | 98 | 95 | 30 | 23 | 0.2 |
| Supporting substrate | 100 | 100 | 100 | 0 | 0 |

Further, the obtained bonded body was subjected to evaluation of bonding strength by the crack-opening method and obtained a value of 0.75 J J/m². Further, the surface 2b of the piezoelectric material layer 2 was ground and polished so that the thickness was changed from the initial 250 μm to 30 μm. Peeling of the bonded part did not occur during the grinding and polishing steps. As it was further ground and polished to a thickness of 20 μm, peeling of the bonded part occurred during the grinding and polishing steps.

Inventive Examples 2 to 4

Bonded bodies were produced according the same procedure as the Comparative Example 1. However, the acceleration voltages irradiated onto the bonding surfaces of the substrates during the bonding were changed to 1.0 kV, 1.2 kV and 1.5 kV in the Inventive Examples 2, 3 and 4, respectively.

The obtained bonded bodies were then subjected to the measurement of the respective atomic ratios of oxygen (O), aluminum (Al), silicon (Si), tantalum (Ta) and argon (Ar) of the piezoelectric material layer, interface layer, supporting substrate-side intermediate layer and supporting substrate, respectively. The results are shown in Tables 3, 4 and 5.

Further, the obtained bonded bodies were subjected to evaluation of bonding strength by the crack-opening method, and bulk fracture occurred in all of the bonded bodies. Further, the surfaces 2b of the piezoelectric material layers 2 were ground and polished so that the thickness were changed from the initial 250 μm to 20 μm. Peeling of the bonded part did not occur during the grinding and polishing steps.

TABLE 3

| | Inventive Example 2 | | | | |
|---|---|---|---|---|---|
| Unit | O Relative Ratio | Al Relative Ratio | Si Relative ratio | Ta Relative ratio | Ar Atom % |
| Piezoelectric Material layer | 101 | 0 | 0 | 100 | 0 |
| Interface layer | 91 | 45 | 70 | 60 | 1.8 |
| Supporting substrate-side intermediate layer | 90 | 114 | 18 | 22 | 0.2 |
| Supporting substrate | 100 | 100 | 100 | 0 | 0 |

TABLE 4

Inventive Example 3

| Unit | O Relative Ratio | Al Relative Ratio | Si Relative ratio | Ta Relative ratio | Ar Atom % |
|---|---|---|---|---|---|
| Piezoelectric Material layer | 114 | 0 | 0 | 100 | 0 |
| Interface layer | 87 | 31 | 61 | 88 | 2.5 |
| Supporting substrate-side intermediate layer | 97 | 112 | 23 | 16 | 0.2 |
| Supporting substrate | 100 | 100 | 100 | 0 | 0 |

TABLE 5

Inventive Example 4

| Unit | O Relative Ratio | Al Relative Ratio | Si Relative ratio | Ta Relative ratio | Ar Atom % |
|---|---|---|---|---|---|
| Piezoelectric Material layer | 107 | 0 | 0 | 100 | 0 |
| Interface layer | 87 | 38 | 79 | 74 | 2.2 |
| Supporting substrate-side intermediate layer | 91 | 116 | 21 | 19 | 0.2 |
| Supporting substrate | 100 | 100 | 100 | 0 | 0 |

The invention claimed is:

1. A bonded body comprising a supporting substrate and a piezoelectric material layer, said supporting substrate comprising mullite, and said piezoelectric material layer comprising a material comprising $LiAO_3$ where A represents one or more element selected from the group consisting of niobium and tantalum;
   wherein said bonded body comprises an interface layer present along an interface between said supporting substrate and said piezoelectric material layer and a supporting substrate-side intermediate layer present between said interface layer and said supporting substrate; and
   wherein each of said interface layer and said supporting substrate-side intermediate layer comprises a material containing all of oxygen, aluminum, silicon and one or more element selected from the group consisting of niobium and tantalum as main components.

2. The bonded body of claim 1, wherein said interface layer has a silicon ratio higher than a silicon ratio of said supporting substrate-side intermediate layer.

3. The bonded body of claim 1, wherein said interface layer has said silicon ratio of 41 or higher and 98 or lower, provided that 100 is assigned to a silicon ratio of said supporting substrate.

4. The bonded body of claim 3, wherein said interface layer has said silicon ratio of 51 or higher and 89 or lower, provided that 100 is assigned to said silicon ratio of said supporting substrate.

5. The bonded body of claim 4, wherein said interface layer has said silicon ratio of 61 or higher and 79 or lower, provided that 100 is assigned to said silicon ratio of said supporting substrate.

6. The bonded body of claim 1, wherein said supporting substrate-side intermediate layer has an aluminum ratio higher than an aluminum ratio of said supporting substrate.

7. The bonded body of claim 6, wherein said supporting substrate-side intermediate layer has said aluminum ratio of 112 or higher and 116 or lower, provided that 100 is assigned to said aluminum ratio of said supporting substrate.

8. An acoustic wave device comprising:
   said bonded body of claim 1; and
   an electrode provided on said piezoelectric material layer.

9. The bonded body of claim 1, wherein said interface layer has an atomic ratio of said element A selected from the group consisting of niobium and tantalum of 50 to 90, provided that 100 is assigned to an atomic ratio of said element A of said piezoelectric material layer.

10. The bonded body of claim 1, wherein said supporting substrate-side intermediate layer has an atomic ratio of said element A selected from the group consisting of niobium and tantalum of 6 to 30, provided that 100 is assigned to an atomic ratio of said element A of said piezoelectric material layer.

* * * * *